United States Patent
Sohn et al.

(10) Patent No.: US 7,539,825 B2
(45) Date of Patent: May 26, 2009

(54) MULTI-PORT MEMORY DEVICE PROVIDING PROTECTION SIGNAL

(75) Inventors: Han-Gu Sohn, Suwon-si (KR); Woon-Sik Suh, Yongin-si (KR); Yun-Tae Lee, Seoul (KR); Sei-Jin Kim, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 120 days.

(21) Appl. No.: 11/345,054

(22) Filed: Feb. 1, 2006

(65) Prior Publication Data

US 2006/0161338 A1 Jul. 20, 2006

Related U.S. Application Data

(63) Continuation-in-part of application No. 11/050,807, filed on Feb. 7, 2005.

(30) Foreign Application Priority Data

| Feb. 7, 2004 | (KR) | ............................ 2004-0008176 |
| Feb. 7, 2005 | (KR) | ....................... 10-2005-0011295 |

(51) Int. Cl.
*G06F 12/00* (2006.01)
*G06F 13/18* (2006.01)

(52) U.S. Cl. .................... 711/149; 711/147; 711/151

(58) Field of Classification Search ................ 711/149, 711/151, 153
See application file for complete search history.

(56) References Cited

U.S. PATENT DOCUMENTS

| 5,247,637 | A | * | 9/1993 | Leedom et al. | ............. 711/149 |
| 5,560,031 | A | * | 9/1996 | Vankan et al. | ................ 712/34 |
| 6,108,756 | A | * | 8/2000 | Miller et al. | ................ 711/148 |
| 6,314,499 | B1 | * | 11/2001 | Kermani | ..................... 711/147 |
| 6,816,889 | B1 | | 11/2004 | Graham | ..................... 709/213 |
| 6,847,578 | B2 | * | 1/2005 | Ayukawa et al. | ....... 365/230.03 |

FOREIGN PATENT DOCUMENTS

| JP | 60-129865 | 7/1985 |
| JP | 07-319755 | 12/1995 |
| JP | 09-081449 | 3/1997 |

* cited by examiner

*Primary Examiner*—Gary J Portka
(74) *Attorney, Agent, or Firm*—F. Chau & Associates, LLC.

(57) ABSTRACT

A memory system includes a first external device, a second external device, and a multi-port memory device connected to the first and second external devices. The multi-port memory system includes: a first port and a second port connected to the first and second external devices, respectively, a first bank group having at least one memory bank, the first bank group configured to be accessed by the first external device through the first data port; a second bank group having at least one memory bank, the second bank group configured to be accessed by the second external device through the second data port; a third bank group having at least one memory bank, wherein the third bank group is configured to be selectively accessed by the first external device through the first data port or the second external device through the second data port. The multi-port memory system may prevent data collisions which occur when two ports simultaneously attempt to access the same memory bank.

14 Claims, 4 Drawing Sheets

MULTI-PORT MEMORY DEVICE PROVIDING PROTECTION SIGNAL

CROSS-REFERENCE TO RELATED APPLICATIONS

This application is a continuation in part of U.S. patent application Ser. No. 11/050,807, filed on Feb. 7, 2005, entitled "MULTI-PORT MEMORY DEVICE PROVIDING PROTECTION SIGNAL," which claims priority to Korean Patent Application No. 2004-0008176, filed on Feb. 7, 2004, the disclosure of which is herein incorporated by reference in its entirety.

BACKGROUND OF THE INVENTION

1. Field of the Invention

The present invention relates to semiconductor memory devices and/or multi-port memory devices.

2. Description of the Related Art

A conventional dual port memory device includes a shared memory and input/output device in, for example, an integrated package. The conventional dual port memory device reads and/or writes data to a memory contained therein, for example, in response to a read and/or write signal.

FIG. 1 is a block diagram of an example conventional dual port memory device 100. Referring to FIG. 1, the dual port memory device 100 includes two interfaces 102 and 104, which are connected to external devices (not shown); and a controller 106, which controls signals input/output through the interfaces 102 and 104. The controller 106 reads data stored in a memory 108, and/or writes (stores) data in the memory 108. The data stored in the memory 108 may be output from the controller 106.

The interfaces 102 and 104 receive chip-enable signals $\overline{CE_L}$ and $\overline{CE_R}$, read/write signals $R/W_L$ and $R/W_R$, address signals $A0_L$ through $A13_L$ (hereinafter, referred to as a first address signal) and, $A0_R$ through $A13_R$ (hereinafter, referred to as a second address signal) from external devices (not shown), respectively, and transfers these signals to the controller 106. The controller 106 analyzes the signals and reads and/or writes the analyzed results as data signals ($D0_L$ through $D7_L$ and/or $D0_R$ through $D7_R$ to and/or from the memory 108 under the control of the external devices. 'L' represents a left port of the dual port memory device 100, and 'R' represents a right port of the dual port memory device 100.

However, when the first address signal $A0_L$ through $A13_L$ and the second address signal $A0_R$ through $A13_R$ received from the external devices are the same, which indicates that the external devices have requested access to the same memory bank in the memory 108, an access collision may occur in the dual port memory device 100.

SUMMARY OF THE INVENTION

Exemplary embodiments of the present invention provide a multi-port memory device.

In an exemplary embodiment of the present invention, a multi-port memory device includes a first port and a second port connected to a first and second external device, respectively; a first bank group having at least one memory bank, the first bank group configured to be accessed by the first external device through the first port; a second bank group having at least one memory bank, the second bank group configured to be accessed by the second external device through the second port; a third bank group having at least one memory bank, wherein the third bank group is configured to be selectively accessed by the first external device through the first port or the second external device through the second port.

In an exemplary embodiment of the present invention, a memory system includes a first external device, a second external device, and a multi-port memory device connected to the first and second external devices. The multi-port memory device includes a first port and a second port connected to the first and second external devices, respectively, a first bank group having at least one memory bank, the first bank group configured to be accessed by the first external device through the first port, a second bank group having at least one memory bank, the second bank group configured to be accessed by the second external device through the second port, and a third bank group having at least one memory bank that are shared by the first and second ports and are selectively accessed by the first external device through the first port or the second external device through the second port.

In an exemplary embodiment of the present invention, the memory system further includes a selection circuit receives a first bank selection signal and a second bank selection signal to select a same bank in the third bank group, and transfers a first protection signal and a second protection signal to each of the first and second external devices according to a priority. The selection circuit may include: a priority decision unit for receiving a first bank selection signal and a second bank selection signal to select a same bank in the third bank group, and generates a first allowance signal and a second allowance signal according to a priority; and a protection signal generator for generating a first protection signal and a second protection signal in response to the first and second allowance signals.

In an exemplary embodiment of the present invention, the memory system further includes a register for storing the priority.

In an exemplary embodiment of the present invention, the register stores allocation information about allocation of the banks in the first to third bank groups.

In an exemplary embodiment of the present invention, the first external device is a modem and the second external device is an AP (access point).

In an exemplary embodiment of the present invention, the multi-port memory device is an SDRAM (synchronous dynamic random access memory).

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
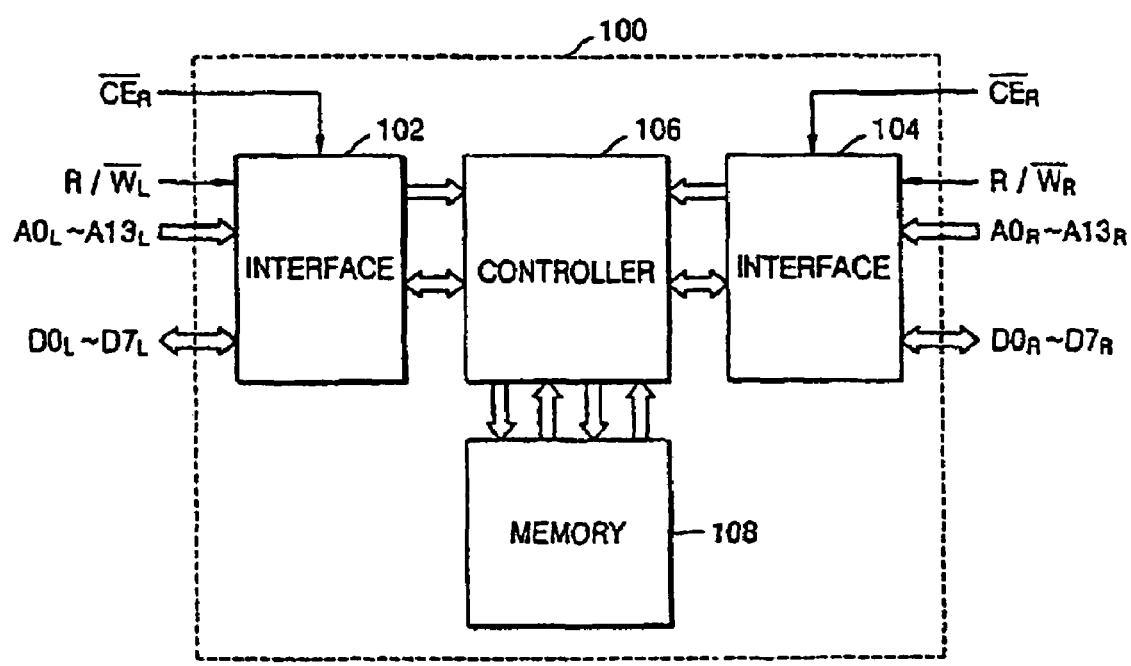
FIG. 1 is a block diagram of a conventional dual port memory device.

Exemplary embodiments of the present invention will be described in detail with reference to the accompanying drawings. Like reference numerals refer to like components throughout the drawings.

Figure 2:
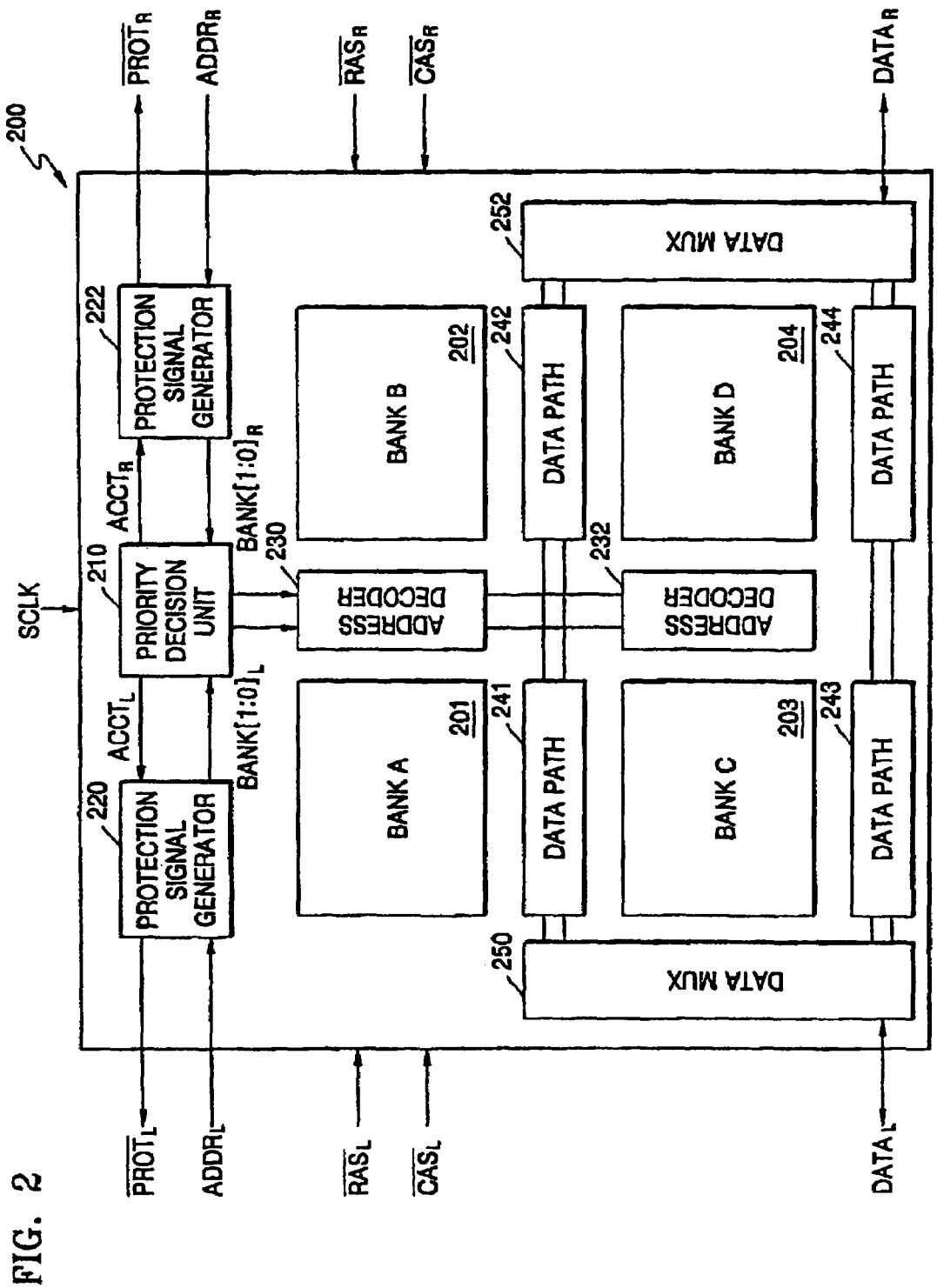
FIG. 2 is a block diagram of a multi-port memory device according to an exemplary embodiment of the present invention.

FIG. 2 is a block diagram of a multi-port memory device according to an exemplary embodiment of the present invention. Referring to FIG. 2, the multi-port memory device 200, which may be a synchronous dynamic random access memory (SDRAM), includes a plurality of banks 201, 202, 203, and 204, a priority decision unit 210, protection signal generators 220 and 222, address decoders 230 and 232, data paths 241, 242, 243, and 244, and data MUXs 250 and 252.

The multi-port memory device 200 receives a signal clock signal SCLK, a first port group and a second port group. The first port group may include a first RAS signal $\overline{RAS_L}$, a first CAS signal $\overline{CAS_L}$, a first address signal $ADDR_L$, a first data signal, $DATA_L$ and a first protection signal PROT1 $PROT_L$. The second port group may include a second RAS signal $\overline{RAS_R}$, a second CAS signal $\overline{CAS_R}$, a second address signal $ADDR_R$, a second data signal $DATA_R$ and a second protection signal $PROT_R$. The first and second RAS signals $\overline{RAS_L}$ and $\overline{RAS_R}$, the first and second CAS signals $\overline{CAS_L}$ and $\overline{CAS_R}$, and the first and second address signals $ADDR_L$ and $ADDR_R$ may be well known to the skilled artisan, and thus, a detailed description thereof has been omitted.

The first and second protection signals $PROT_L$ and $PROT_R$ inform external devices (not shown) of granted access (e.g., access allowance) or denied access (e.g., access disallowance) to the multi-port memory device 200. The first and second protection signals $PROT_L$ and $PROT_R$ may be generated by the priority decision unit 210 and the protection signal generators 220 and 222.

The priority decision unit 210 compares a first bank selection signal $BANK[1:0]_L$ with a second bank selection signal $BANK[1:0]_R$ to determine whether the first bank selection signal $BANK[1:0]_L$ and second bank selection signal $BANK[1:0]_R$ indicate the same bank (e.g., 201, 202, 203, and/or 204). The first bank selection signal $BANK[1:0]_L$ may be included in the first address $ADDR_L$, which may be included in the first port group. The second bank selection signal $BANK[1:0]_R$ may be included in the second address $ADDR_R$, which may be included in the second port group.

If the first bank selection signal $BANK[1:0]_L$ and second bank selection signal $BANK[1:0]_R$ do not indicate the same bank, the priority decision unit 210 generates a first acceptance signal $ACCT_L$ and a second acceptance signal $ACCT_L$, which may have the same logic level. For example, the first acceptance signal $ACCT_L$ and the second acceptance signal $ACCT_R$ may have a higher logic level (e.g., a logic "HIGH" or logic "1"). The first acceptance signal $ACCT_L$ and the second acceptance signal $ACCT_R$, which may have the same logic value, may be input to the protection signal generators 220 and 222, respectively. The protection signal generators 220 and 222 output the first acceptance signal $ACCT_L$ and the second acceptance signal $ACCT_R$ as first and second protection signals $PROT_L$ and $PROT_R$, respectively. The first and second protection signals $PROT_L$ and $PROT_R$ may have the same logic level (e.g., a logic "HIGH" or logic "1"), and external devices (not shown), which may be connected via the first port group and the second port group, may access the multi-port memory device 200.

If the first bank selection signal $BANK[1:0]_L$ and the second bank selection signal $BANK[1:0]_R$ indicate the same bank, the priority decision unit 210 selectively generates a first acceptance signal $ACCT_L$ and second acceptance signal $ACCT_R$, which may have different logic levels. In exemplary embodiments of the present invention, the first acceptance signal $ACCT_L$ or second acceptance signal $ACCT_R$, have a higher logic level (e.g., a logic "HIGH" or logic "1"), according to a priority (e.g., a hardwired priority).

For example, if the first acceptance signal $ACCT_L$ is generated to have a higher logic level (e.g., a logic "HIGH" or logic "1"), and a second acceptance signal $ACCT_R$ is generated to have a lower logic level (e.g., a logic "LOW" or logic "0"), a first protection signal $PROT_L$ is generated to have a higher logic level (e.g., a logic "HIGH" or logic "1") and the second protection signal $PROT_R$ is generated to have a lower logic level (e.g., a logic "LOW" or logic "0"). If the first protection signal $PROT_L$ has a higher logic level, an external device, which may be connected via the first port group, may access the multi-port memory device 200, and an external device, which may be connected via the second port group, may not access the multi-port memory device 200.

Figure 3:
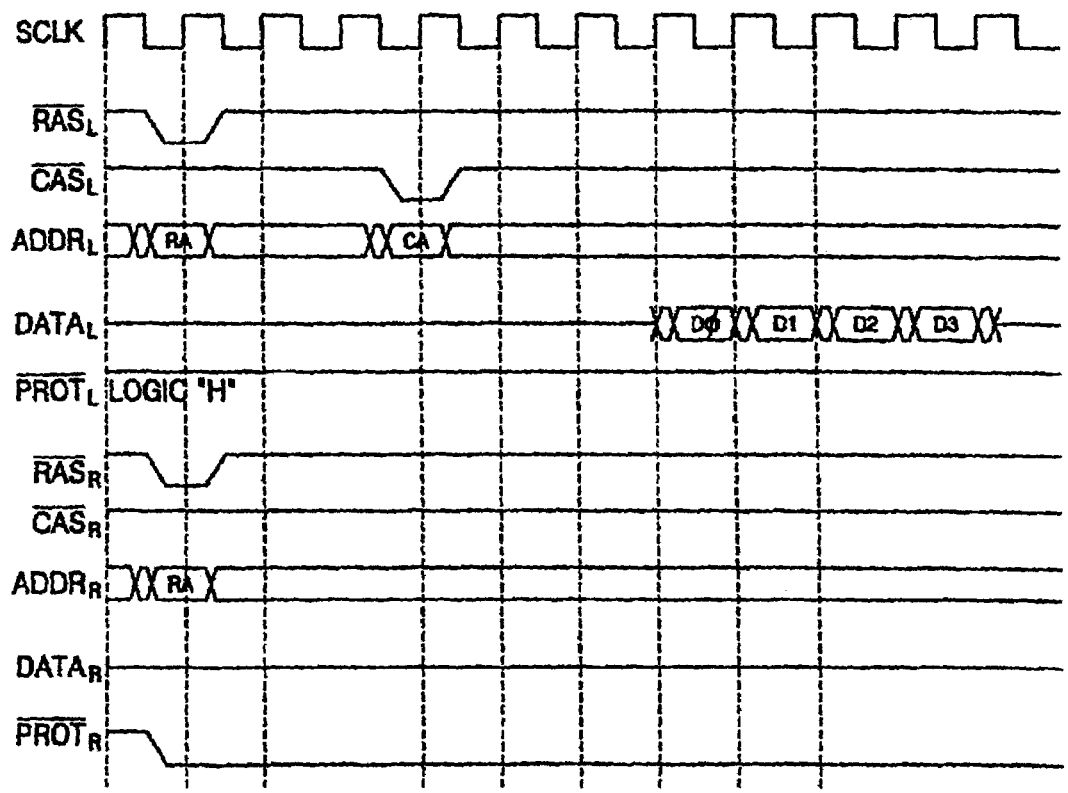
FIG. 3 is an example of an operation timing diagram of a multi-port memory device according to an exemplary embodiment of the present invention.

FIG. 3 is an example of an operation timing diagram of a multi-port memory device according to an exemplary embodiment of the present invention. Referring to FIG. 3, a row address RA, which may be input as a first address signal $ADDR_L$, and a first RAS signal $\overline{RAS_L}$ may be input to the multi-port memory device 200 in synchronization with a system clock signal SCLK. The same row address RA, which may be input as a second address signal $ADDR_R$, and a second RAS signal $\overline{RAS_R}$ may be input to the multi-port memory device 200 in synchronization with the system clock signal SCLK. As illustrated in FIG. 3, if the row address RA indicates the same bank, (e.g., one of 201, 202, 203, and 204), a first protection signal $PROT_L$ remains in a higher logic state (e.g., logic "HIGH" or logic "1"), and a second protection signal $PROT_R$ transitions to a lower logic state (e.g., logic "LOW" or logic "0").

Data D0 through D3, which may correspond to a burst length, may be output through a first data signal $DATA_L$, which may be included in the first port group; no data, or substantially no data, may be input/output through a second data signal $DATA_R$, which may be included in the second port group.

In a multi-port memory device 200, according to exemplary embodiments of the present invention, if first and second address signals $ADDR_L$ and $ADDR_R$ indicate the same memory bank, granted access to an address signal $ADDR_L$ input to one of two ports may suppress memory collision. As described above, in a multi-port memory device 200 according to an exemplary embodiment of the present invention, a protection signal is generated in response to a priority (e.g., a hardwired priority) and/or a bank address signal, access (e.g., simultaneous access) to the same memory bank is controlled, and access or memory collision may be suppressed.

Figure 4:
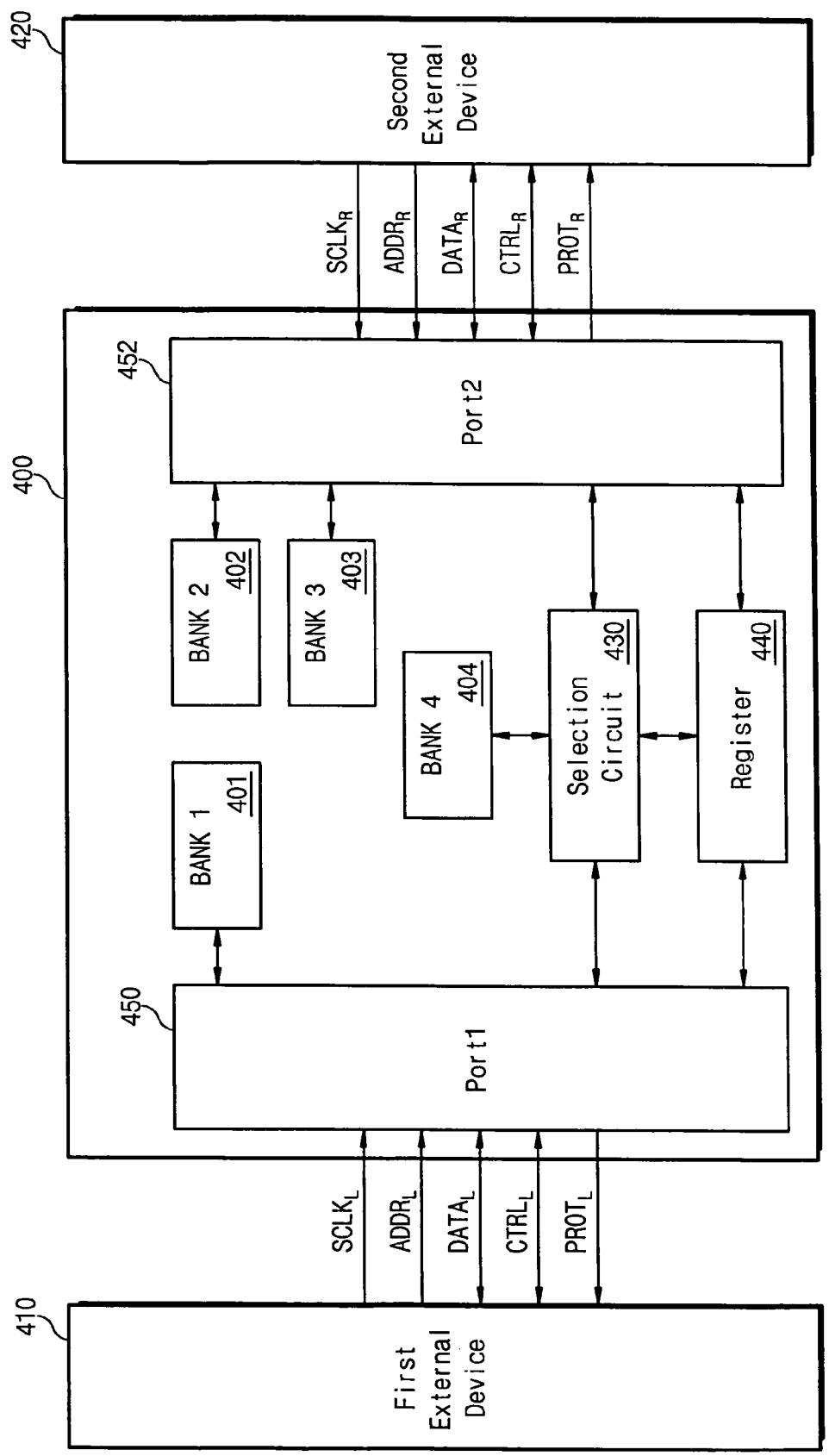
FIG. 4 is a block diagram of a multi-port memory device according to an exemplary embodiment of the present invention.

FIG. 4 is a block diagram of a multi-port memory device according to an exemplary embodiment of the present invention. Referring to FIG. 4, the multi-port memory device 400, which may be a synchronous dynamic random access memory (SDRAM), includes a plurality of banks 401 to 404, a selection circuit 430, a register 440, and first and second ports 450 and 452. The multi-port memory device 400 may be connected to a first external device 410 such as a modem and a second external device 420 such as an access point (AP). In an exemplary embodiment of the present invention, the first external device 410, which is a modem, is connected to a first port 450 of the multi-port memory device 400, and the second external device 420, which may be an access point (AP), may be connected to a second port 452 of the multi-port memory device 400.

The first port 450 receives a first system clock signal $SCLK_L$, a first address signal $ADDR_L$, a first data signal $DATA_L$, a first control signal $CTRL_L$, and a first protection signal $PROT_L$. The second port 452 receives a second system clock signal $SCLK_R$, a second address signal $ADDR_R$, a second data signal $DATA_R$, a second control signal $CTRL_R$ and a second protection signal $PROT_R$. The first and second control signals $CTRL_L$ and $CTRL_R$ may comprise first and second RAS signals $\overline{RAS_L}$ and $\overline{RAS_R}$, and first and second CAS signals $\overline{CAS_L}$ and $\overline{CAS_R}$, respectively. Since the first and second control signals $CTRL_L$ and $CTRL_R$ (e.g., first and second RAS signals $\overline{RAS_L}$ and $\overline{RAS_R}$, first and second CAS signals $\overline{CAS_L}$ and $\overline{CAS_R}$) and the first and second address signals $ADDR_L$ and $ADDR_R$ may be well known to those of ordinary skill in the art, further description is omitted in the interests of clarity.

The first and second protection signals $PROT_L$ and $PROT_R$ inform the first and second external devices 410 and 420 of granted access (e.g., access allowance) or denied access (e.g., access disallowance) to the multi-port memory device 400.

In an exemplary embodiment of the present invention, the plurality of banks 401 to 404 is divided into bank groups. For example, a first bank group includes bank 401, a second bank group includes banks 402 and 403, and a third bank group includes bank 404. In accordance with an exemplary embodiment of the present invention, a first bank group (e.g., bank 401) can be accessed through the first port 450, and a second bank group (e.g., banks 402 and 403) can be accessed through the second port 452. A third bank group (e.g., bank 404) is a shared bank which may be shared by the first and second ports 450 and 452. The third group (e.g., bank 404) may be accessed through both of the first and second ports 450 and 452.

The selection circuit 430 may include the priority decision unit 210 and the protection signal generators 220 and 222 of FIG. 2. The priority decision unit 210 compares a first bank selection signal with a second bank selection signal and generates first and second acceptance signals $ACCT_L$ and $ACCT_R$ according to predetermined priorities (e.g., hardwired priorities). The protection signal generators 220 and 222 output the first and second protection signals $PROT_L$ and $PROT_R$ in response to the first and second acceptance signals $ACCT_L$ and $ACCT_R$. The first bank selection signal $BANK[1:0]_L$ may be included in the first address $ADDR_L$, which may be included in the first port group. The second bank selection signal $BANK[1:0]_R$ may be included in the second address $ADDR_R$, which may be included in the second port group.

If the third bank group includes a plurality of banks, the selection circuit 430 compares the first bank selection signal $BANK[1:0]_L$ with the second bank selection signal $BANK[1:0]_R$. If the first bank selection signal and the second bank selection signal do not indicate the same bank, the selection circuit 430 generates a first protection signal $PROT_L$ and second protection signal $PROT_R$, which may have the same logic level. If the first protection signal $PROT_L$ has a higher logic level, the first and second external devices 410 and 420, which may be connected via the first and second ports 450 and 452, may access the multi-port memory device 400.

If the first bank selection signal $BANK[1:0]_L$ and second bank selection signal $BANK[1:0]_R$ indicate the same bank, e.g., the bank 404, the selection circuit 430 selectively generates a first protection signal $PROT_L$ and second protection signal $PROT_R$, which may have a higher logic level (e.g., a logic "HIGH" or logic "1"), according to a priority (e.g., a hardwired priority). For example, if the first protection signal $PROT_L$ is generated to have a higher logic level (e.g., a logic "HIGH" or logic "1"), and the second protection signal $PROT_R$ is generated to have a lower logic level (e.g., a logic "LOW" or logic "0"), the first external device 410, which may be connected via the first port 450, may access the fourth bank 404, and the second external device 420 which may be connected via the second port 452, may not access the fourth bank 404.

The register 440 stores a priority to access the banks in the third bank group. Hereinafter, a bit for the priority is referred to as a semaphore bit. For example, if the first port 450 has a higher priority to access the bank 404, the semaphore bit may be stored as 1. If the second port 452 has a higher priority to access the fourth bank 404, the semaphore bit may be stored as 0. The selection circuit 430 controls access to the bank 404 via the first port 450 and the second port 452 according to the stored value of the semaphore bit, which is stored in the register 440, to prevent data collisions by the first and second ports 450 and 452.

In an exemplary embodiment of the present invention, the register 440 also stores allocation information about allocation of the banks 401 to 404 to the first and second ports 450 and 452. For example, the register 440 stores information that the bank 401 is allocated to the first port 450, the banks 402 and 403 are allocated to the second port 452, and the bank 404 is allocated to the first and second ports 450 and 452 as a shared bank. It will be understood that the multi-port memory device according to exemplary embodiments of present invention may store various allocation information about various allocations of any suitable number of memory banks to any suitable number of ports.

As described above, the multi-port memory device 400 according to the second embodiment includes banks of the first plurality of memory banks connected to the first port 450, banks of the second plurality of memory banks connected to the second port 452, and banks of the third plurality of memory banks shared by the first and second ports 450 and 452. The multi-port memory device 400 controls the banks of the third bank group to be accessed by only one of ports. The multi-port memory device 400 may prevent data collisions which occur when the first port and the second port simultaneously attempt to access the same bank.

Referring to FIG. 4, the memory system according to an exemplary embodiment of the present invention includes first and second external devices 410 and 420; and a multi-port memory device 400, which may be interposed between the first and second external devices 410 and 420, connected to the first and second external devices 410 and 420. The memory system shown in FIG. 4 can be effectively used in a mobile system. For example, the first external device, which may be a modem, may be connected to a NOR Flash memory and SRAM, and the second external device, which may be an AP (access point), may be connected to a DRAM (dynamic random access memory) and NAND Flash memory.

As described above, in memory system including a multi-port memory device according to an exemplary embodiment of the present invention, a protection signal is generated in response to a priority (e.g., a hardwired priority) and/or a bank address signal, access (e.g., simultaneous access) to the same memory bank is controlled, and access or memory collision may be suppressed.

Although exemplary embodiments of the present invention have been described with respect to higher logic levels (e.g., logic level "1"), and lower logic levels (e.g., logic level "0"), it will be understood that any suitable logic level may be used and/or these higher logic levels may be interchangeable.

Although exemplary embodiments of the present invention have been described with regard to memory banks (e.g., 401-404), it will be understood that exemplary embodiments of the present invention may be used in connection with any suitable memory location or the like.

Although the memory system including multi-port memory device according to exemplary embodiments of present invention has been described with respect to a multi-port memory device with two ports, in the interests of clarity and simplicity, it will be understood that the memory system including multi-port memory device according to exemplary embodiments of present invention may have any suitable number of ports, for example, two or more ports.

Although exemplary embodiments of the present invention have been described in detail with reference to the accompanying drawings for the purpose of illustration and description, it is to be understood that the inventive devices and systems are not to be construed as limited thereby. It will be apparent to those of ordinary skill in the art that various modifications to the foregoing exemplary embodiments can be made without departing from the scope of the invention as defined by the appended claims, with equivalents of the claims to be included therein.

What is claimed is:

1. A multi-port memory device comprising:
a first port and a second port connected to a first and second external device, respectively;
a first bank group having at least one memory bank, the first bank group configured to be accessed by the first external device through the first port;
a second bank group having at least one memory bank, the second bank group configured to be accessed by the second external device through the second port;
a third bank group having at least one memory bank, wherein the third bank group is configured to be selectively accessed by the first external device through the first port and the second external device through the second port; and
a selection circuit that receives requests from the first port and the second port to access a same bank of the third bank group and grants access to the requested bank in the third bank group to one of the first and second external devices and denies access to the other device according to a priority value stored in the multi-port memory device,
wherein the priority value indicates which of the first and second ports has a higher priority, and
wherein the requests comprise a first bank selection signal and a second bank selection signal and the selection circuit transfers a first protection signal to the device that is granted access and a second protection signal to the device that is denied access according to the priority.

2. The multi-port memory device of claim 1, wherein the selection circuit includes:
a priority decision unit to receive the first bank selection signal and the second bank selection signal to select the same bank in the third bank group, and to generate a first acceptance signal and a second acceptance signal according to the priority; and
a protection signal generator for generating the first protection signal and the second protection signal in response to the first and second acceptance signals.

3. The multi-port memory device of claim 1, wherein the stored priority is implemented as a hardwired configuration.

4. The multi-port memory device of claim 1, further comprising a register for storing the priority.

5. The multi-port memory device of claim 4, wherein the register stores allocation information indicating (1) which of the banks in the first to third bank groups are allocated only to the first port, (2) which of the banks in the first to third bank groups are allocated only to the second port, and (3) which of the first to third bank groups are shared by both the first and second ports.

6. The multi-port memory device of claim 1, wherein the first external device is a modem and the second external device is an AP (access point).

7. The multi-port memory device of claim 1, wherein the multi-port memory device is an SDRAM (synchronous dynamic random access memory).

8. A memory system comprising:
a first processor;
a second processor; and
a multi-port memory device connected to the first and second processors,
wherein the multi-port memory device includes:
a first port and a second port connected to the first and second processors, respectively;
a first bank group having at least one memory bank, the first bank group configured to be accessed by the first processor through the first port;
a second bank group having at least one memory bank, the second bank group configured to be accessed by the second processor through the second port;
a third bank group having at least one memory bank, wherein the third bank group is configured to be selectively accessed by the first processor through the first port and the second processor through the second port; and
a selection circuit that receives requests from the first port and the second port to access a same bank of the third bank group and grants access to the requested bank in the third bank group to one of the first and second processors and denies access to the other processor according to a priority value stored in the multi-port memory device,
wherein the priority value indicates which of the first and second ports has a higher priority, and
wherein the requests comprise a first bank selection signal and a second bank selection signal and the selection circuit transfers a first protection signal to the processor that is granted access and a second protection signal to the processor that is denied access according to the priority.

9. The memory system of claim 8, wherein the selection circuit includes:
a priority decision unit to receive the first bank selection signal and a second bank selection signal to select the same bank in the third bank group, and to generate a first acceptance signal and a second acceptance signal according to the priority; and
a protection signal generator for generating the first protection signal and the second protection signal in response to the first and second acceptance signals.

10. The memory system of claim 9, wherein the stored priority is implemented as a hardwired configuration.

11. The memory system of claim 8, further comprising a register for storing the priority.

12. The memory system of claim 11, wherein the register stores allocation information indicating (1) which of the banks in the first to third bank groups are allocated only to the first port, (2) which of the banks in the first to third bank groups are allocated only to the second port, and (3) which of the first to third bank groups are shared by both the first and second ports.

13. The memory system of claim 8, wherein the first processor is a modem and the second processor is an AP (access point).

14. The memory system of claim 8, wherein the multi-port memory device is an SDRAM (synchronous dynamic random access memory).

* * * * *